United States Patent
Imran et al.

(10) Patent No.: US 8,709,604 B2
(45) Date of Patent: *Apr. 29, 2014

(54) BARRIER LAYERS COMPRISING NI-INCLUSIVE TERNARY ALLOYS, COATED ARTICLES INCLUDING BARRIER LAYERS, AND METHODS OF MAKING THE SAME

(75) Inventors: Muhammad Imran, Brownstown, MI (US); Bernd Disteldorf, Mettlach (DE); Marcus Frank, Ann Arbor, MI (US); Richard Blacker, Farmington Hills, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 376 days.

This patent is subject to a terminal disclaimer.

(21) Appl. No.: 13/064,064

(22) Filed: Mar. 3, 2011

(65) Prior Publication Data

US 2012/0225317 A1 Sep. 6, 2012

(51) Int. Cl.
*B32B 17/06* (2006.01)
*B32B 15/04* (2006.01)

(52) U.S. Cl.
USPC ........... 428/432; 428/433; 428/434; 428/689; 428/699; 428/701; 428/702

(58) Field of Classification Search
CPC ........ C03C 17/00; C03C 17/06; C03C 17/22; C03C 17/23; C03C 17/34; C03C 17/3411; C03C 17/36; C03C 17/3602; C03C 17/3607; C03C 17/3615; C03C 17/3618; C03C 17/3644; C03C 17/3652; C03C 17/3613; C03C 17/3681; C03C 17/366

USPC ........ 428/428, 432, 688, 689, 701, 702, 433, 428/434, 699

See application file for complete search history.

(56) References Cited

U.S. PATENT DOCUMENTS

| | | |
|---|---|---|
| 873,746 A | 12/1907 | Haynes |
| 4,410,489 A | 10/1983 | Asphahani et al. |
| 4,537,798 A | 8/1985 | Cohen |

(Continued)

FOREIGN PATENT DOCUMENTS

| | | |
|---|---|---|
| EP | 0 386 993 | 9/1990 |
| EP | 0 622 645 | 11/1994 |

(Continued)

OTHER PUBLICATIONS machine design (http://machinedesign.com/basics-design/nickel).*

(Continued)

*Primary Examiner* — David Sample
*Assistant Examiner* — Lauren Colgan
(74) *Attorney, Agent, or Firm* — Nixon & Vanderhye P.C.

(57) ABSTRACT

Certain example embodiments relate to Ni-inclusive ternary alloy being provided as a barrier layer for protecting an IR reflecting layer comprising silver or the like. The provision of a barrier layer comprising nickel, chromium, and/or molybdenum and/or oxides thereof may improve corrosion resistance, as well as chemical and mechanical durability. In certain examples, more than one barrier layer may be used on at least one side of the layer comprising silver. In still further examples, a $Ni_xCr_yMo_z$-based layer may be used as the functional layer, rather than or in addition to as a barrier layer, in a coating.

11 Claims, 8 Drawing Sheets

(56) References Cited

U.S. PATENT DOCUMENTS

| | | | |
|---|---|---|---|
| 4,820,486 A | 4/1989 | Shimogori et al. | |
| 4,906,437 A | 3/1990 | Heubner et al. | |
| 5,242,560 A | 9/1993 | Lingle et al. | |
| 5,595,825 A | 1/1997 | Guiselin | |
| 5,821,001 A | 10/1998 | Arbab et al. | |
| 5,942,338 A | 8/1999 | Arbab et al. | |
| 6,045,896 A | 4/2000 | Boire et al. | |
| 6,159,607 A | 12/2000 | Hartig et al. | |
| 6,159,621 A | 12/2000 | Schicht et al. | |
| RE37,446 E | 11/2001 | Miyazaki et al. | |
| 6,340,529 B1 | 1/2002 | Ebisawa et al. | |
| 6,346,174 B1 | 2/2002 | Finley et al. | |
| 6,398,925 B1 | 6/2002 | Arbab et al. | |
| 6,472,072 B1 | 10/2002 | Ebisawa et al. | |
| 6,503,636 B1 | 1/2003 | Le Masson et al. | |
| 6,541,133 B1 | 4/2003 | Schicht et al. | |
| 6,562,490 B2 | 5/2003 | Ebisawa et al. | |
| 6,572,940 B1 | 6/2003 | Noethe et al. | |
| 6,576,349 B2 | 6/2003 | Lingle et al. | |
| 6,579,427 B1 | 6/2003 | Arbab et al. | |
| 6,582,809 B2 | 6/2003 | Boire et al. | |
| 6,602,608 B2 | 8/2003 | Stachowiak | |
| 6,610,410 B2 | 8/2003 | Ebisawa et al. | |
| 6,699,585 B2 | 3/2004 | Ebisawa et al. | |
| 6,783,861 B2 | 8/2004 | Ebisawn et al. | |
| 6,783,876 B2 | 8/2004 | Schicht et al. | |
| 6,797,389 B1 | 9/2004 | Depauw | |
| 6,802,943 B2 | 10/2004 | Stachowiak | |
| 6,899,953 B1 | 5/2005 | O'Shaughnessy et al. | |
| 6,967,060 B2 | 11/2005 | Stachowiak | |
| 7,060,359 B2 | 6/2006 | Eby et al. | |
| 7,101,810 B2 | 9/2006 | Bond et al. | |
| 7,166,360 B2 | 1/2007 | Coustet et al. | |
| 7,198,850 B2 | 4/2007 | DePauw | |
| 7,329,433 B2 | 2/2008 | O'Shaughnessy et al. | |
| 7,339,728 B2 | 3/2008 | Hartig | |
| 7,342,716 B2 | 3/2008 | Hartig | |
| 7,494,717 B2 | 2/2009 | Decroupet et al. | |
| 7,572,509 B2 | 8/2009 | Hartig | |
| 7,572,510 B2 | 8/2009 | Hartig | |
| 7,572,511 B2 | 8/2009 | Hartig | |
| 7,582,356 B2 | 9/2009 | Brochot et al. | |
| 7,655,313 B2 | 2/2010 | Blacker et al. | |
| 7,745,009 B2 | 6/2010 | Decroupet et al. | |
| 7,807,248 B2 | 10/2010 | German et al. | |
| 7,858,191 B2 | 12/2010 | Lemmer et al. | |
| 7,901,781 B2 * | 3/2011 | Maschwitz et al. | 428/432 |
| 7,906,203 B2 | 3/2011 | Hartig | |
| 8,231,977 B2 * | 7/2012 | Roquiny et al. | 428/433 |
| 2002/0022132 A1 | 2/2002 | Ebisawa et al. | |
| 2003/0194488 A1 * | 10/2003 | Stachowiak | 427/162 |
| 2004/0197574 A1 | 10/2004 | Stachowiak | |
| 2004/0224167 A1 | 11/2004 | Stachowiak | |
| 2007/0281171 A1 * | 12/2007 | Coster et al. | 428/432 |
| 2008/0226925 A1 | 9/2008 | Blacker et al. | |
| 2008/0311389 A1 * | 12/2008 | Roquiny et al. | 428/336 |
| 2009/0136765 A1 * | 5/2009 | Maschwitz et al. | 428/432 |
| 2009/0169846 A1 * | 7/2009 | Siddle et al. | 428/216 |
| 2009/0176086 A1 * | 7/2009 | Martin et al. | 428/332 |
| 2009/0205956 A1 | 8/2009 | Lu et al. | |
| 2009/0214880 A1 | 8/2009 | Lemmer | |
| 2009/0324934 A1 | 12/2009 | Blacker et al. | |
| 2009/0324967 A1 | 12/2009 | Disteldorf et al. | |
| 2010/0075155 A1 | 3/2010 | Veerasamy | |
| 2010/0104840 A1 | 4/2010 | Blacker et al. | |
| 2010/0178492 A1 * | 7/2010 | Schicht et al. | 428/336 |
| 2011/0027562 A1 * | 2/2011 | Di Stefano | 428/216 |
| 2012/0107587 A1 * | 5/2012 | Martin et al. | 428/216 |
| 2012/0225304 A1 | 9/2012 | Imran et al. | |
| 2012/0225316 A1 | 9/2012 | Imran et al. | |
| 2013/0117992 A1 | 5/2013 | Imran et al. | |
| 2013/0118674 A1 | 5/2013 | Imran et al. | |

FOREIGN PATENT DOCUMENTS

| | | | |
|---|---|---|---|
| EP | 0 779 255 | | 6/1997 |
| FR | 2 924 232 | | 5/2009 |
| WO | WO2007110552 | * | 10/2007 |
| WO | WO 2010/053921 | | 5/2010 |

OTHER PUBLICATIONS

Haynes International (http://www.haynesintl.com/pdf/h2019.pdf).*
glasssolutions (http://www.aisglass.com/insulated_glass_units.asp).*
U.S. Appl. No. 12/926,714, Lemmer et al., filed Dec. 6, 2010.
U.S. Appl. No. 12/923,082, McLean et al., filed Aug. 31, 2010.
U.S. Appl. No. 12/662,894, Lemmer et al., filed May 10, 2010.
U.S. Appl. No. 12/659,196, Lemmer et al., filed Feb. 26, 2010.
U.S. Appl. No. 12/385,802, Lu et al., filed Apr. 21, 2009.
U.S. Appl. No. 12/461,792, Blacker et al., filed Sep. 18, 2006.
U.S. Appl. No. 12/591,611, Veerasamy, filed Dec. 21, 2006.
U.S. Appl. No. 12/213,879, Disteldorf et al., filed Jun. 25, 2008.
U.S. Appl. No. 12/654,594, Blacker et al., filed Mar. 15, 2007.
U.S. Appl. No. 13/064,066, filed Mar. 3, 2011; Frank et al.
U.S. Appl. No. 13/064,065, filed Mar. 3, 2011; Blacker et al.
International Search Report dated Apr. 23, 2012.
U.S. Appl. No. 13/064,063, filed Mar. 3, 2011; Imran et al.
U.S. Appl. No. 13/064,062, filed Mar. 3, 2011; Imran et al.
U.S. Appl. No. 13/736,330, filed Jan. 8, 2013; Imran et al.
U.S. Appl. No. 13/735,218, filed Jan. 7, 2013; Imran et al.

* cited by examiner

BARRIER LAYERS COMPRISING NI-INCLUSIVE TERNARY ALLOYS, COATED ARTICLES INCLUDING BARRIER LAYERS, AND METHODS OF MAKING THE SAME

This application incorporates by reference the entire contents of U.S. application Ser. No. 13/064,065, entitled "Barrier Layers Comprising Ni and/or Ti, Coated Articles Including Barrier Layers, and Methods of Making the Same," as well as U.S. application Ser. No. 13,064,066, entitled "Coated Article Including Low-Emissivity Coating, Insulating Glass Unit Including Coated article, and/or Methods of Making the Same."

Certain example embodiments of this invention relate to a coated article including at least one infrared (IR) reflecting layer of a material such as silver or the like, e.g., in a low-E coating. In certain embodiments, a Ni-inclusive ternary alloy may be used as at least one layer in the coating. In certain examples, this Ni-inclusive ternary alloy may be provided as a barrier layer for an IR reflecting layer comprising silver or the like. In other example embodiments, the Ni-inclusive ternary alloy includes nickel, chromium, and/or molybdenum (e.g., $Ni_xCr_yMo_z$, etc.). In certain example embodiments, the provision of a layer comprising nickel, chromium, and/or molybdenum and/or oxides thereof permits a layer to be used that has improved corrosion resistance, as well as improved chemical and mechanical durability. In certain example embodiments, the Ni-inclusive ternary alloy may further include Ti, Cr, Nb, Zr, Mo, W, Co, and/or combinations thereof. In further examples, more than one barrier layer may be used on at least one side of the layer comprising silver. A Ni-inclusive layer may be provided adjacent a layer comprising silver, and a second metal-based layer may be provided adjacent the Ni-inclusive layer. In other examples, a third barrier layer comprising a metal oxide may be provided adjacent the second metal-based barrier layer.

Certain example embodiments of this invention also relate to using a $Ni_xCr_yMo_z$-based layer as the functional layer, rather than or in addition to as a barrier layer, in a coating. Example coated articles herein may be used in the context of insulating glass (IG) window units, vehicle windows, or in other suitable applications such as monolithic window applications, laminated windows, and/or the like.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like. In certain example instances, designers of coated articles often strive for a combination of high visible transmission, low emissivity (or low emittance), and/or low sheet resistance ($R_s$). High visible transmission may permit coated articles to be used in applications where these characteristics are desired such as in architectural or vehicle window applications, whereas low-emissivity (low-E), and low sheet resistance characteristics permit such coated articles to block significant amounts of IR radiation so as to reduce for example undesirable heating of vehicle or building interiors. Thus, typically, for coatings used on architectural glass to block significant amounts of IR radiation, high transmission in the visible spectrum is often desired.

The IR reflecting layer(s) in low-E coatings impact the overall coating, and in some cases the IR reflecting layer(s) is the most sensitive layer in the stack. Unfortunately, IR reflecting layers comprising silver may sometimes be subject to damage from the deposition process, subsequent atmospheric processes, heat treatment, chemical attacks, and/or because of harsh environments. In certain cases, a silver-based layer in a low-E coating may need to be protected from oxygen, from chemical attacks such as from acidic and/or alkaline solutions, thermal oxidation, corrosion, and from damage occurring because of moisture including contaminants such as oxygen, chlorine, sulfur, acids and/or bases. If the IR reflecting layer(s) in the coating is/are not sufficiently protected, the durability, visible transmission, and/or other optical characteristics of the coated article may suffer.

Accordingly, it will be appreciated by one skilled in the art that the there is a need for a low-E coating with improved durability and improved or substantially unchanged optical properties.

Certain example embodiments of this invention relate to an improved barrier layer material comprising an Ni-inclusive ternary alloy used in connection with an IR reflecting layer comprising silver. In certain instances, the improved barrier layer material may permit the durability of the coated article to be improved. However, other example embodiments relate to an IR reflecting layer comprising a Ni-inclusive ternary alloy (e.g., nickel, chromium, and/or molybdenum). In these cases, the use of an IR reflecting layer comprising a Ni-inclusive ternary alloy may also result in a coated article having an improved chemical and/or mechanical durability.

Certain example embodiments of this invention relate to a method of making a coated article including a coating supported by a glass substrate. In certain example embodiments, the method comprises: disposing a dielectric layer on the glass substrate; disposing a first barrier layer comprising a Ni-inclusive ternary alloy over the dielectric layer; disposing an IR reflecting layer comprising silver over the Ni-inclusive ternary alloy; and disposing a second barrier layer comprising a Ni-inclusive ternary alloy over the IR reflecting layer, wherein the coating is used as a low-E coating.

Other example embodiments relate to a method of making a coated article, the method comprising: disposing a dielectric layer on a glass substrate; disposing a first barrier layer over the dielectric layer; disposing an IR reflecting layer comprising silver over the Ni-inclusive ternary alloy; and disposing a second barrier layer over the IR reflecting layer, wherein the coating is used as a low-E coating, wherein the first and second barrier layers comprise 54-58 wt. % Ni, 20-22.5 wt. % Cr, and 12.5-14.5 wt. % Mo.

Still further example embodiments relate to a coated article. In some cases, the coated article comprises a substrate supporting a low-E coating. The low-E coating may comprise, in order moving away from the substrate: a first dielectric layer; a first barrier layer; a first IR reflecting layer comprising silver, provided over and contacting the first barrier layer; a second barrier layer, provided over and contacting the IR reflecting layer; and a second dielectric layer provided over the second barrier layer, wherein the first and second barrier layers comprise 54-58 wt. % Ni, 20-22.5 wt. % Cr, and 12.5-14.5 wt. % Mo.

Other embodiments of this invention related to a method of making a coated article including a coating supported by a glass substrate, the method comprising: disposing a dielectric layer on the substrate; disposing a first sub-barrier layer comprising one or more of Nb, Ti, Cr, and Zr over the dielectric layer; disposing a first barrier layer comprising a Ni-inclusive alloy over and contacting the first sub-barrier layer; disposing an IR reflecting layer comprising silver over and contacting the first barrier layer comprising an Ni-inclusive alloy; disposing a second barrier layer comprising a Ni-inclusive alloy over and contacting the IR reflecting layer; and disposing a second sub-barrier layer comprising one or more of Nb, Ti, Cr, and Zr over and contacting the Ni-inclusive barrier layer.

Still further example embodiments also relate to a method of making a coated article including a coating supported by a glass substrate. In some cases, the method comprises: disposing a dielectric layer on the substrate; disposing a first sub-barrier layer comprising one or more of Nb, Ti, Cr, and Zr over the dielectric layer; disposing a first barrier layer comprising Ni, Cr, Ti, and/or Mo over and contacting the first sub-barrier layer; disposing an IR reflecting layer comprising silver over and contacting the first barrier layer comprising Ni, Cr, Ti, and/or Mo; disposing a second barrier layer comprising Ni, Cr, Ti, and/or Mo over and contacting the IR reflecting layer; and disposing a second sub-barrier layer comprising one or more of Nb, Ti, Cr, and Zr over and contacting the layer comprising Ni, Cr, Ti, and/or Mo.

Other example embodiments relate to a method of making a coated article, the method comprising: disposing a dielectric layer on a glass substrate; disposing a first barrier layer over the dielectric layer; disposing an IR reflecting layer comprising silver over and contacting the first barrier layer; disposing a second barrier layer comprising NiTi or an oxide thereof over and contacting the IR reflecting layer; disposing a third barrier layer comprising NiCr or an oxide thereof over and contacting the second barrier layer; and disposing a fourth barrier layer comprising an oxide of Sn, Ti, Cr, Nb, Zr, Mo, W, and/or Co over and contacting the third barrier layer.

Additional example embodiments relate to a coated article. The coated article comprises a low-E coating. The coating comprises: a glass substrate; a dielectric layer; a first sub-barrier layer comprising one or more of Nb, Ti, Cr, and Zr over the dielectric layer; a first barrier layer comprising Ni, Cr, Ti, and/or Mo over and contacting the first sub-barrier layer; an IR reflecting layer comprising silver over and contacting the first barrier layer comprising Ni, Cr, Ti, and/or Mo; a second barrier layer comprising Ni, Cr, Ti, and/or Mo over and contacting the IR reflecting layer; and a second sub-barrier layer comprising one or more of Nb, Ti, Cr, and Zr over and contacting the layer comprising Ni, Cr, Ti, and/or Mo.

Still another example embodiment of this invention relates to a method of making a coated article comprising a coating supported by a glass substrate, the method comprising: disposing a first dielectric layer on the substrate; disposing an IR reflecting layer comprising 54-58 wt. % Ni, 20-22.5 wt. % Cr, and 12.5-14.5 wt. % Mo over and contacting the first dielectric layer; and disposing a second dielectric layer over and contacting the IR reflecting layer.

Other examples relate to method of making a coated article comprising a coating supported by a glass substrate, the method comprising: disposing a first dielectric layer comprising silicon nitride on the substrate; disposing an IR reflecting layer comprising 54-58 wt. % Ni, 20-22.5 wt. % Cr, and 12.5-14.5 wt. % Mo over and contacting the first dielectric layer; disposing a barrier layer comprising NbZr over and contacting the IR reflecting layer; disposing a second dielectric layer comprising silicon nitride over and contacting the IR reflecting layer; and disposing an overcoat layer comprising an oxide of zirconium over and contacting the second dielectric layer.

Example embodiments of this invention also relate to a coated article comprising: a glass substrate; a first dielectric layer comprising silicon nitride on the substrate; an IR reflecting layer comprising 54-58 wt. % Ni, 20-22.5 wt. % Cr, and 12.5-14.5 wt. % Mo over and contacting the first dielectric layer; a barrier layer comprising NbZr over and contacting the IR reflecting layer; a second dielectric layer comprising silicon nitride over and contacting the IR reflecting layer; and an overcoat layer comprising an oxide of zirconium over and contacting the second dielectric layer.

Certain example embodiments also relate to coated articles and/or IG units made by one of the above-described and/or other methods.

DETAILED DESCRIPTION OF EXAMPLE EMBODIMENTS OF THE INVENTION

Referring now to the drawings in which like reference numerals indicate like parts throughout the several views.

Coated articles herein may be used in coated article applications such as monolithic windows, IG window units, vehicle windows, and/or any other suitable application that includes single or multiple substrates such as glass substrates.

As indicated above, in certain cases, IR reflecting layers (e.g., a silver-based layer) in a low-E coating may need to be protected from damage arising from subsequent deposition processes, thermal oxidation, corrosion, moisture, chemical attacks, and/or harsh environments. For example, the oxygen in the plasma used to deposit subsequent layers may be highly ionized and the silver-based layer may need to be protected from it. Also, in post-deposition "atmospheric processes," the silver-based layer may be susceptible to attacks from oxygen, moisture, acids, bases, and/or the like. This may be particularly true if a layer located between the silver-based layer and the atmosphere has any defects, such that the silver-based layer is not covered entirely (e.g., scratches, pin holes, etc.).

For example, degradation of coatings including layers comprising silver may also be caused by a physical restructuring of the Ag in the layer and its resulting disruption of overlying layers upon heating, in certain instances. Problems may arise during heat-treating in certain example embodiments. In those cases, oxygen may diffuse into the silver-based layer. In certain example embodiments, oxygen that reaches the silver-based layer may affect its properties, such as by decreasing sheet resistance, affecting emissivity, and/or producing haze, etc., and may result in reduced performance by the layer stack. In other cases, Ag agglomeration may cause defects.

In certain example embodiments, barrier layers may therefore be used with silver-based layers (and/or other IR reflecting layers) in low-E coatings in order to reduce the occurrence of some or all of the above-described and/or other issues. In certain exemplary cases, these barrier layers may form a thin protective oxide layer around the silver, and improve the corrosion resistance, chemical, and/or mechanical durability of the coated article.

Certain embodiments of this invention relate to a coated article that includes at least one glass substrate supporting a coating. The coating typically has at least one infrared (IR) reflecting layer that reflects and/or blocks at least some IR radiation. The IR reflecting layer(s) may be of or include a material such as silver, gold, NiCr, and/or ternary alloys thereof, or the like, in different embodiments of this invention. Often, an IR reflecting layer is sandwiched between at least first and second contact layers of the coating.

In view of the foregoing, it would be advantageous to provide a barrier layer comprising a Ni-inclusive ternary alloy. In certain examples, the barrier layer may comprise material(s) such as nickel, chromium, and/or molybdenum (e.g., Haynes alloys such as C22, BC1, and/or B3). In other example embodiments, the Ni-inclusive ternary alloy may further include Ti, Cr, Nb, Zr, Mo, W, Co and/or combinations thereof. In certain instances, a Ni-inclusive ternary alloy barrier layer (e.g., comprising materials such as nickel, chromium, and/or molybdenum, etc.) may have (1) sufficient adhesion to the IR reflecting layer; (2) improved corrosion resistance to acidic and/or alkaline solutions; (3) protection during high temperature oxidation; and (4) improved overall chemical and/or mechanical durability. In other example embodiments, these advantages may arise from using a layer comprising nickel, chromium, and/or molybdenum as an IR reflecting layer and/or other functional layer, rather than as a barrier layer.

Furthermore, in other example embodiments, more than one barrier layer may be provided. It has advantageously been found that the provision of at least two barrier layers on at least one side of the IR reflecting layer (and in some cases both sides) may result in the aforesaid advantages. In certain example embodiments, a Ni-inclusive alloy or Ni-inclusive ternary alloy may be used adjacent to an IR reflecting layer, and a material providing good corrosion resistances, and good chemical and mechanical durability may be chosen as the second barrier layer.

Figure 1:
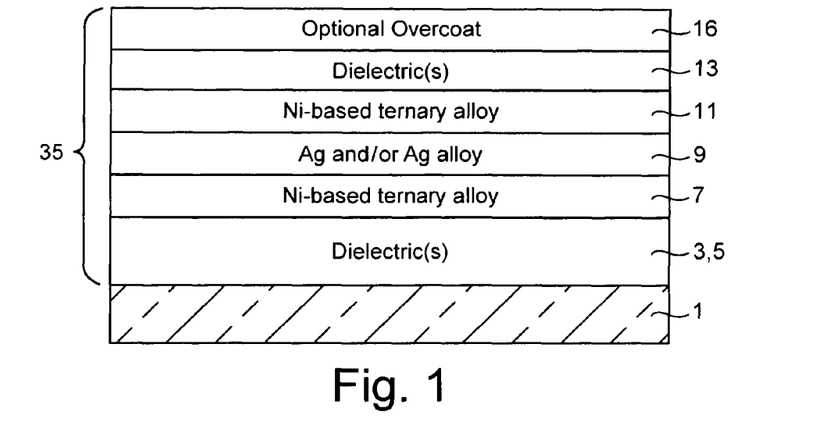
FIG. 1 is a cross-sectional view of a coated article comprising a single IR reflecting layer and Ni-inclusive ternary alloy barrier layers according to an example embodiment of this invention.

FIG. 1 is a cross-sectional view of a coated article according to an example embodiment of this invention. In certain example embodiments, the coated article illustrated in FIG. 1 may be used as a monolithic window with a low-E coating on surface 1 and/or 2, where the low-E coating includes only a single IR reflecting layer. However, in other example embodiments, the coated article in FIG. 1 may comprise further layers. Furthermore, a coated article made according to example embodiments described herein may be used in an insulated glass unit (IGU), with the coating(s) on surface 1, 2, 3, and/or 4; in a laminated monolithic lite with the coating embedded against the interlayer on surfaces 2 and/or 3, or exposed on surface 1 or 4; in a laminated IGU, with a laminate outboard with the coating embedded against the interlayer on surfaces 2 and/or 3, or exposed on surface 4 or elsewhere; in a laminated IGU, with a laminated inboard with the coated exposed on surfaces 3 and/or 6, or embedded on surfaces 4 and/or 5, according to different example embodiments and applications. In other words, this coating may be used monolithically, or in IG units comprising two or more substrates, or more than once in a glass unit, and may be provided on any surface of the unit in different example embodiments.

The coated article includes glass substrate 1 (e.g., clear, green, bronze, or blue-green glass substrate from about 1.0 to 10.0 mm thick, more preferably from about 1.0 mm to 6.0 mm thick), and a multi-layer coating 35 (or layer system) provided on the substrate either directly or indirectly.

As shown in FIG. 1, the coating 35 comprises optional dielectric layer(s) 3 and/or 5, first barrier layer 7 comprising a Ni-inclusive ternary alloy, which may be of or include Ni, Ti, Cr, Nb, Zr, Mo, W, Co and/or combinations thereof (e.g., $Ni_xCr_yMo_z$, $Ni_xTi_yCr_z$, $Ni_xTi_yNb_z$, $Ni_xNb_yZr_z$, $Ni_xCr_yZr_z$, $Ni_xTi_yMo_z$, $Ni_xZr_yMo_z$, $Ni_xNb_yMo_z$, $Ni_xCr_yMo_z$, $Ni_xW_yCr_z$, $Ni_xW_yMo_z$, $Ni_xW_yZr_z$, $Ni_xW_yNb_z$, $Ni_xW_yTi_z$, $Ni_xCo_yMo_z$, $Ni_x$-

$Co_yCr_z$, $Ni_xCo_yMo_z$, $Ni_xCo_yZr_z$, $Ni_xCo_yNb_z$, and/or $Ni_xCo_yTi_z$), IR reflecting layer 9 including one or more of silver, gold, or the like, second barrier layer 11 comprising a Ni-inclusive ternary alloy, which may be of or include Ni, Ti, Cr, Nb, Zr, Mo, W, Co and/or combinations thereof (e.g., $Ni_xCr_yMo_z$, $Ni_xTi_yCr_z$, $Ni_xTi_yNb_z$, $Ni_xNb_yZr_z$, $Ni_xCr_yZr_z$, $Ni_xTi_yMo_z$, $Ni_xZr_yMo_z$, $Ni_xNb_yMo_z$, $Ni_xCr_yMo_z$, $Ni_xW_yCr_z$, $Ni_xW_yMo_z$, $Ni_xW_yZr_z$, $Ni_xW_yNb_z$, $Ni_xW_yTi_z$, $Ni_xCo_yMo_z$, $Ni_xCo_yCr_z$, $Ni_xCo_yMo_z$, $Ni_xCo_yZr_z$, $Ni_xCo_yNb_z$, and/or $Ni_xCo_yTi_z$), and optional dielectric layer(s) 13, that may in certain example instances be a protective overcoat. Other layers and/or materials may also be provided in certain example embodiments of this invention, and it is also possible that certain layers may be removed or split in certain example instances. Layers 3, 5, and/or 13 may include one or more discrete layers. Dielectric layers 3, 5, and 13 may be of or include silicon nitride, silicon oxide, silicon oxynitride, tin oxide, titanium oxide, and/or any suitable dielectric material. Optional overcoat layer 16 may be provided in certain example embodiments. In other examples, it may be excluded. In certain example embodiments, when optional overcoat layer 16 is provided, layer 16 may be of or include zirconium. The zirconium-based layer may be oxided partially or fully in different examples. In further example embodiments, layer 16 may comprise an oxide of a zirconium-based alloy, such as $Zr_xMo_yO_z$, ZrAlOx, and/or TiZrOx. These materials may advantageously contribute to better tribological and/or frictional properties of the coating and/or coated article. Other dielectric layers may be provided in other places in the coating in other examples. In certain example embodiments, the layer may be at least initially deposited as a nitride of zirconium.

Infrared (IR) reflecting layer 9 is preferably substantially or entirely metallic and/or conductive, and may comprise or consist essentially of silver (Ag), gold, or any other suitable IR reflecting material. IR reflecting layer 9 helps allow the coating to have low-E and/or good solar control characteristics such as low emittance, low sheet resistance, and so forth. The IR reflecting layer 9 may, however, be slightly oxidized in certain embodiments of this invention.

The IR reflecting layers shown in FIG. 1 and described herein may comprise or consist essentially of silver in different example embodiments. Thus, it will be appreciated that certain example embodiments may include silver alloys. In such cases, Ag may be alloyed with an appropriate amount of Zr, Ti, Ni, Cr, Pd, and/or combinations thereon. In certain example embodiments, Ag may be alloyed with both Pd and Cu, with approximately 0.5-2% (by weight or atomic %) of each of Pd and Cu. Other potential alloys include Ag and one or more of Co, C, Mg, Ta, W, NiMg, PdGa, CoW, Si, Ge, Au, Pt, Ru, Sn, Al, Mn, V, In, Zn, Ir, Rh, and/or Mo. In general, dopant concentrations may be in the range of 0.2-5% (by weight or atomic %), more preferably between 0.2-2.5%. Operating within these ranges may help the silver maintain the desirable optical characteristics of the Ag-based layer that otherwise might be lost by virtue of the alloying, thereby helping to maintain the overall optical characteristics of the stack while also enhancing chemical, corrosion, and/or mechanical durability. The example Ag alloy target materials identified herein may be sputtered using a single target, deposited by co-sputtering using two (or more targets), etc. In addition to providing improved corrosion resistance, the use of Ag alloys may in certain instances help to reduce the silver diffusivity at elevated temperatures while also helping to reduce or block the amount of oxygen movement in the layer stacks. This may further enhance silver diffusivity and may change those Ag growth and structural properties that potentially lead to bad durability.

In certain example embodiments, barrier layer 7 may be of or include an oxide of zinc. It will be appreciated that the first and second Ni-inclusive ternary alloy layers 7 and 11 may have the same or different compositions in different embodiments of this invention.

Dielectric layer 13 may be of or include silicon nitride, silicon oxide, silicon oxynitride, tin oxide, titanium oxide, and the like. Dielectric layer 13 may comprise more than one discrete layer in certain example embodiments. Furthermore, dielectric layer 13 may serve as a protective overcoat in some cases.

It has advantageously been found that the use of, for example, a Ni-inclusive ternary alloy in these layers allows improved corrosion resistance, and better chemical and/or mechanical durability. It is believed that the use of a Ni-inclusive ternary alloy (and or an oxide, nitride, and/or oxynitride thereof) forms a protective layer on the grain boundaries of Ag. This may result in a coated article with better corrosion and/or moisture resistance, and chemical durability, in certain example embodiments. Furthermore, it is believed that oxygen diffusion may be reduced because of the formation of thin protective oxide layers around the IR reflecting layer, which may also help improve corrosion resistance, chemical, and mechanical durability in certain example embodiments.

In certain exemplary embodiments, the Ni-inclusive ternary alloy may comprise nickel, chromium, and/or molybdenum. Nickel and Ni-inclusive alloys may be able to withstand a variety of corrosive environments, high temperatures, high stress, and/or a combination of these factors, in certain example embodiments. However, in some cases, Ni may provide good corrosion resistance in normal environments, but may be sensitive to high temperature moisture and/or acid attacks. Thus, Cr may be added to provide improved corrosion resistance to acidic solutions in certain examples. Cr may also provide protection from high temperature oxidation in other examples.

However, a barrier layer consisting of, or consisting essentially of, Ni and/or Cr may still be improved. For example, a layer consisting essentially of NiCr as-deposited, and heated in air (which may then form an oxide of NiCr), may experience corrosion and/or etching when subjected to hot acidic and alkaline solutions. An NiCr heated coating may be etched away in (1) 20% NaOH (65 degrees C.; 1 hr); (2) 50% H2SO4 (65 degrees C.; 1 hr); and in (3) 5% HCl (65 degrees C.; 1 hr). Furthermore, when subjected to boiling water (100 degrees C.; 1 hr), heated NiCr has been observed to become hazy. This may be because of the formation of chlorides and/or hydrides.

As another example, a NiCr-inclusive layer as-coated (e.g., partially oxidized or less oxided than a heated NiCr-inclusive layer) may be etched away by 50% $H_2SO_4$ (65 degrees C.; 1 hr) and 5% HCl (65 degrees C.; 1 hr). Therefore, it can be seen that an IR reflecting layer (e.g., comprising silver) may be vulnerable to chemical attacks and/or in harsh environments (e.g., in hot and/or humid environments). Therefore, there is a need for an improved barrier layer. This may be particularly true for applications wherein the coated article will be used monolithically or on an outer surface of an IG unit or laminated assembly, because the coating may be exposed to the elements in certain example embodiments.

Thus, in monolithic applications where a coating is provided, in IG units where coatings are provided on surfaces 1 (e.g., for anti-condensation) and/or 4 (e.g., for improving U-value), and other cases where these coatings may be exposed directly to the environment, it may be desirable to use these materials with better corrosion resistance, and improved chemical and/or mechanical durability, e.g., for protection of Ag-based layers.

It has been found that molybdenum, particularly when used with nickel, may improve resistance to acids, as well as to pitting and crevice corrosion, in certain example embodiments. Furthermore, molybdenum, particularly when used with chromium, may provide improved properties with respect to corrosion from alkaline solutions. Therefore, it has advantageously been found that the use of NiCrMo-based alloys surrounding a silver-based layer may provide improved corrosion resistance, and improved chemical and/or mechanical durability in low-E stacks. NiCrMo-based barriers, both as-deposited and heat treated, may provide a coating with improved performance as compared to barrier layers consisting and/or consisting essentially of Ni and Cr.

It has advantageously been found that NiCrMo-based alloys (e.g. C22, BC1, and/or B3 Hallestoy) may protect a coating including at least one silver-based layer better than layers consisting essentially of Ni and Cr in some cases. Furthermore, NiCrMo-based alloys may protect the coated article from visible damage in further examples. It is further believed that NiCrMo may form an alloy with the top dielectric layer (e.g., layer 13) in the coating, which may also even improve the performance of this layer against alkaline solutions and boiling water. This may be particularly true in embodiments where the top dielectric layer 13 is silicon based. For example, materials comprising MoSi are used as heaters at higher temperatures because of their good thermal and corrosion resistance.

Tables 1-3 show the compositions of three example embodiments of NiCrMo-based alloys (e.g., C22, BC1, and B3) for reference.

TABLE 1

First Example Embodiment of $Ni_xCr_yMo_z$ (e.g., C22) - elemental composition by wt. %

| Element | Preferred | More Preferred | Example |
| --- | --- | --- | --- |
| Ni | 40-70% | 50-60% | 54-58% (e.g., 56%) |
| Cr | 5-40% | 10-30% | 20-22.5% |
| Mo | 5-30% | 10-20% | 12.5-14.5% |
| Fe | 0-15% | 0-10% | 1-5% (e.g., 3%) |
| W | 0-15% | 0-10% | 1-5% (e.g., 3%) |
| Co | 0-15% | 0-10% | 1-5% (e.g., 3%) |
| Si | 0-2% | 0-1% | =<0.2% (e.g., .08%) |
| Mn | 0-3% | 0-2% | =<1% (e.g., 0.5%) |
| C | 0-1% | 0-0.5% | =<0.1% (e.g., .01%) |
| V | 0-2% | 0-1% | =<1% (e.g., 0.35%) |
| Al | — | — | — |
| Ti | — | — | — |

TABLE 2

Second Example Embodiment of $Ni_xCr_yMo_z$ (e.g., B3) - elemental composition by wt. %

| Element | Preferred | More Preferred | Example |
| --- | --- | --- | --- |
| Ni | 50-80% | 60-70% | 63-67% (e.g., 65%) |
| Cr | 0-15% | 0-5% | 1-2% (e.g., 1.5%) |
| Mo | 10-50% | 20-40% | 25-30% (e.g., 28.5%) |
| Fe | 0-10% | 0-5% | 1-4% (e.g., 3%) |
| W | 0-15% | 0-10% | 1-5% (e.g., 3%) |
| Co | 0-15% | 0-10% | 1-5% (e.g., 3%) |
| Si | 0-2% | 0-1% | =<0.2% (e.g., .1%) |
| Mn | 0-15% | 0-10% | 1-5% (e.g., 3%) |
| C | 0-1% | 0-0.5% | =<0.1% (e.g., .01%) |
| V | — | — | — |

TABLE 2-continued

Second Example Embodiment of $Ni_xCr_yMo_z$ (e.g., B3) - elemental composition by wt. %

| Element | Preferred | More Preferred | Example |
| --- | --- | --- | --- |
| Al | 0-3% | 0-2% | =<1% (e.g., 0.5%) |
| Ti | 0-2% | 0-1% | =<0.5% (e.g., .2%) |

TABLE 3

Third Example Embodiment of $Ni_xCr_yMo_z$ (e.g., BC1) - elemental composition by wt. %

| Element | Preferred | More Preferred | Example |
| --- | --- | --- | --- |
| Ni | 50-80% | 60-70% | 60-65% (e.g., 62%) |
| Cr | 5-30% | 10-20% | 12-17% (e.g., 15%) |
| Mo | 10-40% | 15-25% | 20-25% (e.g., 22%) |
| Fe | 0-10% | 0-5% | 1-3% (e.g., 2%) |
| W | — | — | — |
| Co | — | — | — |
| Si | 0-2% | 0-1% | =<0.2% (e.g., .08%) |
| Mn | 0-5% | 0-2% | =<0.5% (e.g., 0.25%) |
| C | 0-1% | 0-0.5% | =<0.1% (e.g., 0.01%) |
| V | — | — | — |
| Al | 0-3% | 0-2% | =<1% (e.g., 0.5%) |
| Ti | — | — | — |

Figure 2A:
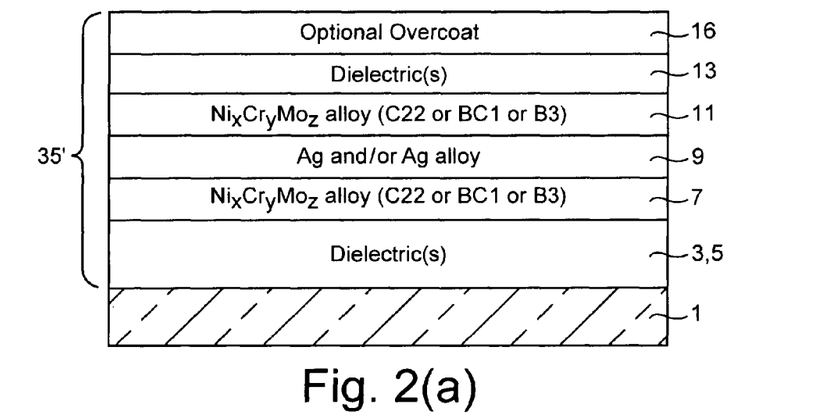
FIGS. 2(a)-(b) are cross-sectional views of coated articles comprising a single IR reflecting layer and $Ni_xCr_yMo_x$-based barrier layers according to an example embodiment of this invention.

FIG. 2(a) includes coating 35'. FIG. 2(a) is based on FIG. 1, except FIG. 2(a) specifically calls for layers 7 and 11 to comprise an alloy comprising NiCrMo. In certain example embodiments, layers 7 and/or 11 may further comprise Fe, W, Co, Si, Mn, C, V, Al, and/or Ti, in potentially small amounts, e.g., as indicated above in Table 1.

Figure 2B:
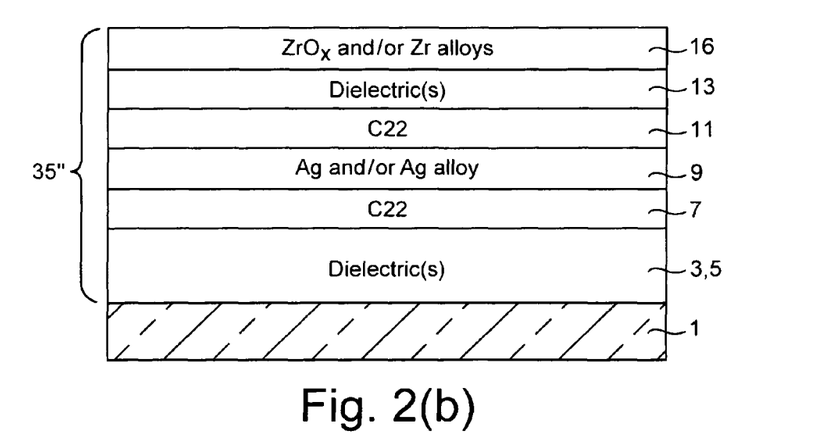

FIG. 2(b) illustrates coating 35". FIG. 2(b) is based on FIGS. 1 and 2(a), except FIG. 2(b) specifically calls for layers 7 and 11 to be of or include Hastelloy C22 and specifies that the optional overcoat includes Zr.

Figure 3A:
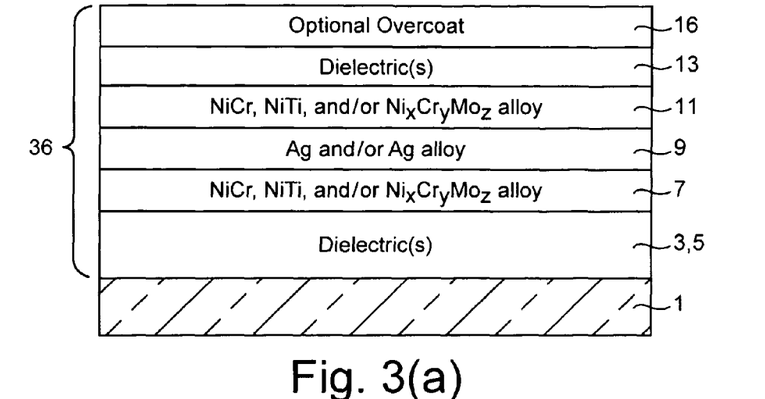
FIGS. 3(a)-(c) are cross-sectional views of coated articles comprising a single IR reflecting layer and barrier layers based on NiCrMo, NiTi and/or NiCr according to an example embodiment of this invention.

FIG. 3(a) illustrates a different example embodiment. In the FIG. 3(a) embodiment, different Ni-based alloys may advantageously be used within one coating 36 in order to further improve the properties of the coating. In example embodiments related to FIGS. 3(a)-(c), the Ni-based alloy is not necessarily ternary. In some cases, the Ni-based alloy may be binary, or may comprise more than 3 metals. For instance, layer 7 may be of or include NiCr (and/or an oxide and/or nitride thereof), while layer 11 is of or includes NiTi (and/or an oxide and/or nitride thereof). In certain example embodiments, a layer stack wherein layer 7 is NiCr-based and layer 11 is NiTi-based, the sheet resistance may be from about 25 to 45% lower than that of a layer stack where layers 7 and 11 are both NiCr-based; more preferably from about 30 to 40% lower, and most preferably at least 34% lower.

As another example, layer 7 may be of or include NiCr (and/or an oxide and/or nitride thereof), while layer 11 is of or includes $Ni_xCr_yMo_z$ (e.g., C22). In certain example embodiments, a layer stack wherein layer 7 is NiCr-based and layer 11 is $Ni_xCr_yMo_z$-based, the sheet resistance may be from about 20 to 35% lower than that of a layer stack where layers 7 and 11 are both NiCr-based; more preferably from about 25 to 30% lower, and most preferably at least 28% lower.

Thus, in certain exemplary embodiments, layer 7 may be of or include at least one of NiCr, $Ni_xCr_yMo_z$ (e.g., C22, B3, BC1, etc.), and NiTi, and layer 11 may also be of or include at least one of NiCr, $Ni_xCr_yMo_z$ (e.g., C22, B3, BC1, etc.), and NiTi, so long as the material chosen for layer 7 is different from the material chosen for layer 11.

Figure 3B:
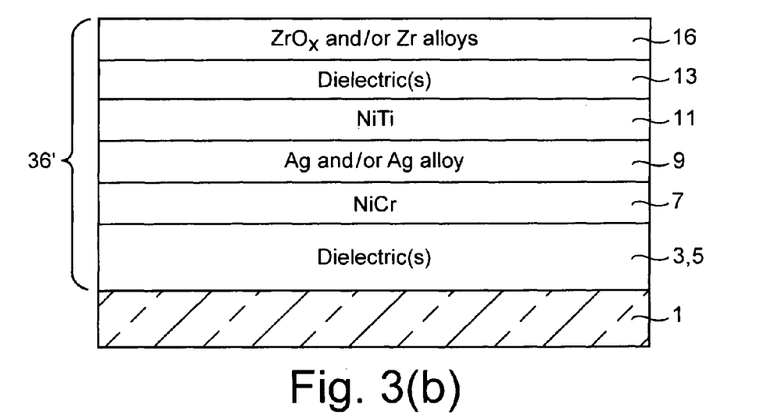

FIG. 3(b) shows a coated article 1 supporting coating 36'. FIG. 3(b) is based on FIG. 3(a), except FIG. 3(b) specifically calls for layer 7 to be of or include NiCr (and/or an oxide and/or nitride thereof), and for layer 11 to be of or include NiTi (and/or an oxide and/or nitride thereof).

Figure 3C:
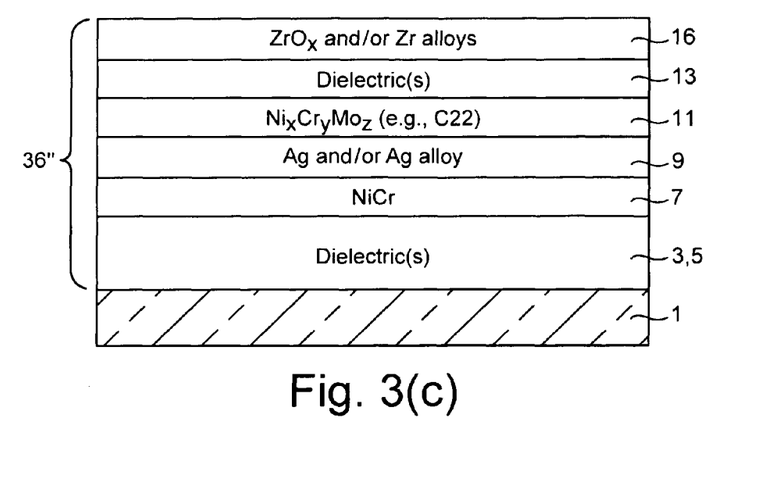

FIG. 3(c) shows a coated article 1 supporting coating 36". FIG. 3(c) is based on FIG. 3(a), except FIG. 3(c) specifically calls for layer 7 to be of or include NiCr (and/or an oxide and/or nitride thereof), and for layer 11 to be of or include $Ni_xCr_yMo_z$ (and/or an oxide and/or nitride thereof).

As discussed above, coatings made according to FIG. 3(a)-(c) may advantageously have a sheet resistance that is significantly reduced, e.g., as compared to a coating including only NiCr-based barrier layers.

Figure 4:
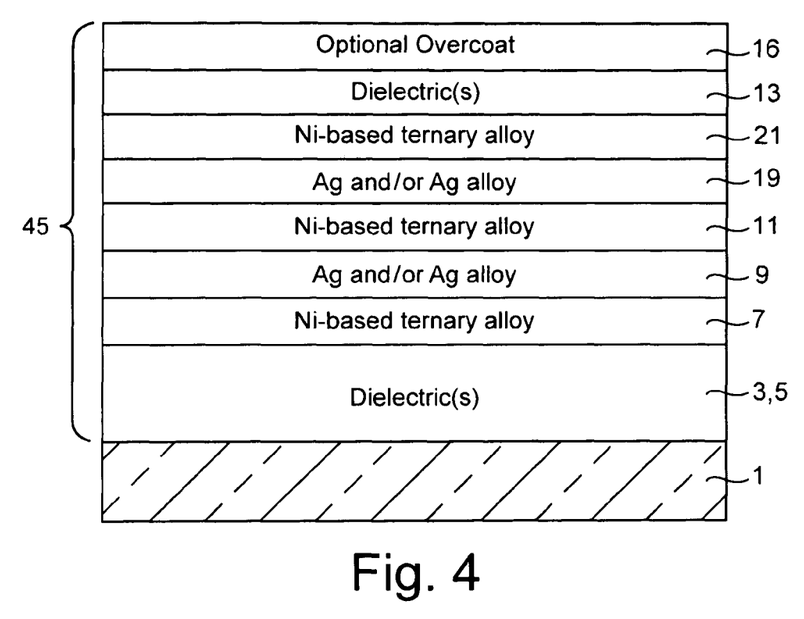
FIG. 4 is a cross-sectional view of a coated article comprising at least two IR reflecting layers and Ni-inclusive ternary alloy barrier layers according to an example embodiment of this invention.

FIG. 4 is a cross-sectional view of a coated article according to an example embodiment of this invention. In certain example implementations, the coated article illustrated in FIG. 4 may be used as a monolithic window with a low-E coating with two IR reflecting layers. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating (or layer system) 45 provided on the substrate either directly or indirectly. The FIG. 4 embodiment includes glass substrate 1, dielectric layer(s) 3 and/or 5, Ni-inclusive ternary alloy 7, silver-based layer 9, Ni-inclusive ternary alloy 11, silver-based layer 19, Ni-inclusive ternary alloy 21, dielectric layer(s) 13 and optional overcoat layer 16. Layers 7, 11, and/or 21 may be of or include any and/or all of the example materials discussed herein with respect to layer 7 in the FIG. 1 example embodiment. Similarly, the Ag-based layers 9 and 19 may be silver alloys as discussed herein. Dielectric layers 3, 5, 13, and 16 are optional. These layers may comprise any of the materials discussed for these layers herein. Some, all, or none of these layers may be provided according to different example embodiments.

Figure 5:
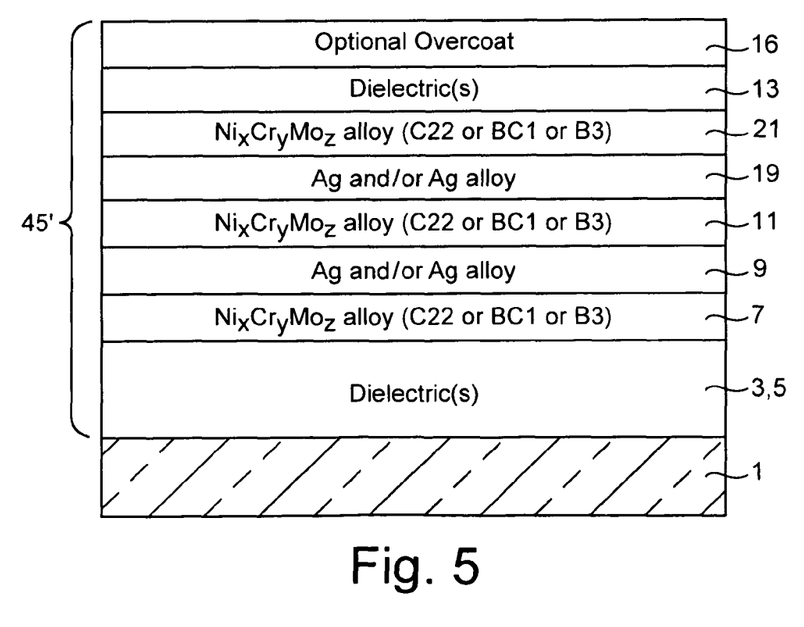
FIG. 5 is a cross-sectional view of a coated article comprising a at least two IR reflecting layers and Hastelloy-based barrier layers according to an example embodiment of this invention

FIG. 5 is based on FIG. 4, and includes coating 45'. FIG. 5 specifies that layers 7, 9, 11 and/or 19 may comprise NiCrMo-based alloys (e.g., C22, BC1, and/or B3).

Figure 6:
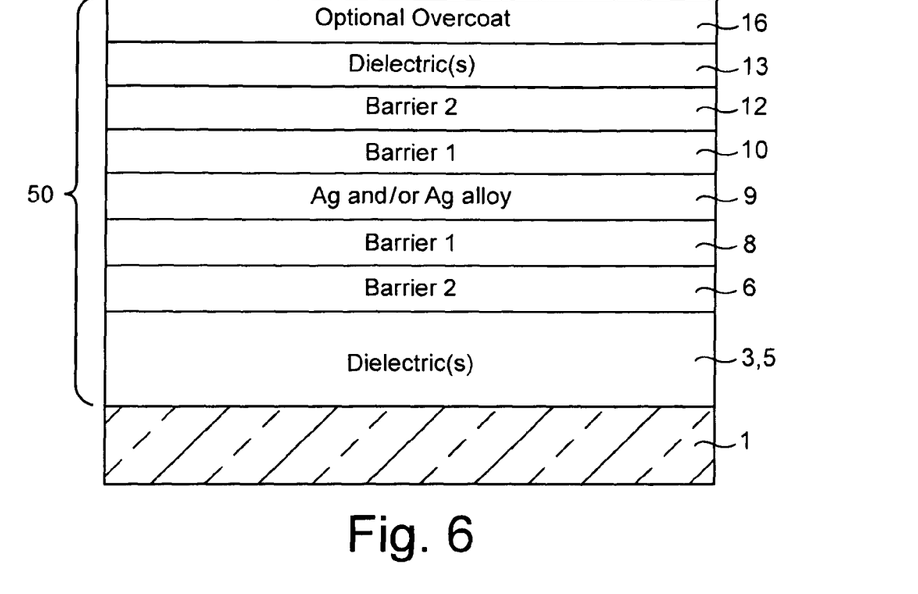
FIG. 6 is a cross-sectional view of a coated article comprising an IR reflecting layer, and first and second barrier layers provided on each side of the IR reflecting layer according to still another example embodiment of this invention.

Other example embodiments, such as that shown in FIG. 6, relate to another aspect of certain example embodiments of this invention alluded to above. In these example embodiments, it has been found that the provision of two barrier layers on each or either side of a functional layer (e.g., an IR reflecting layer comprising silver) may result in improved durability.

More particularly, FIG. 6 is a cross-sectional view of a coated article according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating 50 (or layer system) provided on the substrate either directly or indirectly. Coating 50 is supported by the glass substrate 1 and includes optional dielectric layer(s) 3 and/or 5, first and second barrier layers 8/10 and 6/12 sandwiching silver-based layer 9, dielectric layer(s) 13, and optional overcoat layer 16.

Optional dielectric layer(s) 3, 5, and 13 may be of or include silicon nitride, silicon oxide, silicon oxynitride, titanium oxide, tin oxide, and any other suitable dielectric material. All, none, or some of these layers may be present according to different example embodiments. In further example embodiments, each of these layers may include one or more discrete layers.

Optional overcoat layer 16 may be provided in certain example embodiments. In other examples, it may be excluded. In certain example embodiments, when optional overcoat layer 16 is provided, layer 16 may be of or include zirconium. The zirconium-based layer may be oxided partially and/or fully in certain cases. In further example embodiments, layer 16 may comprise an oxide of a zirconium-based alloy, such as $Zr_xMo_yO_z$, ZrAlOx, and/or TiZrOx. These materials may advantageously contribute to better tribological and/or frictional properties of the coating and/or coated article.

Still referring to FIG. 6, barrier layers 6 and 12 may comprise a material selected for improved corrosion resistance and/or enhanced chemical and mechanical durability. The adhesion between the "barrier 1" layers 8 and 10 (discussed in detail below) and "barrier 2" layers 6 and 12 is advantageous in certain example embodiments. In certain instances, layers 6 and 12 may adhere well to layers 8 and 10 respectively, as well as to dielectric layer 12. Furthermore, the materials for layers 6 and 12 may be chemically compatible with the materials used for layers 8 and 10 in certain embodiments.

For heat treatable (e.g., temperable) coatings, it may be desirable in certain instances that the materials used for layers 6 and 12 be thermally stable. It also may be desirable in certain example instances that these materials not significantly optically or physically degrade the performance of the coating following heat treatment.

In view of the foregoing, it has advantageously been found that "barrier 2" layers 6 and 12 may comprise Nb, Zr, Ti, Cr, and/or Nb. For instance, layers 6 and/or 12 may comprise NbZr, Zr, TiCr, and/or TiNb. These materials provide good corrosion and chemical resistance properties for annealed and/or heat treatable coatings in certain example embodiments. In certain example embodiments, TiCr may be used as "barrier 2" when the coating is annealed. In other example embodiments, Zr, NbZr, and/or TiNb may be used for layers 6 and/or 12 when the coating is heat-treated.

Still referring to the FIG. 6 embodiment, a Ni-inclusive alloy may be used adjacent to the layer 9 comprising silver. In certain example embodiments, "barrier 1" (layers 8 and 10), the barrier layer closest to the layer comprising silver, may be of or include Ni. Layers 8 and/or 10 may further include one or more of Cr, Mo, and/or Ti. NiCrMo, NiCr, and/or NiTi may be used for layers 8 and/or 10 in certain exemplary embodiments. It has advantageously been found that the use of these materials for layers 8 and/or 10, near or adjacent to the silver-based layer, may provide better adhesion and chemical compatibility with the layer comprising Ag. In certain example embodiments, Ti alone may not provide strong corrosion resistance, but it may when alloyed with Ni advantageously shift the alloy potential in the noble, or positive, direction, and therefore may provide better protection for the Ag. In certain examples, heat treatable (e.g., heat strengthened and/or thermally temperable) NiTi may provide improved performance, particularly with respect to durability and optics.

Furthermore, the above-mentioned materials for layers 8 and 10 may also provide improved Ag dispersion in certain example embodiments. It is believed that providing better structural properties of the Ag may help to achieve better optical properties such as dispersion. It further is presently believed that the provision of a layer comprising NiTiOx next to a layer comprising Ag may reduce agglomeration and early Ag film coalescence in certain instances.

Figure 7:
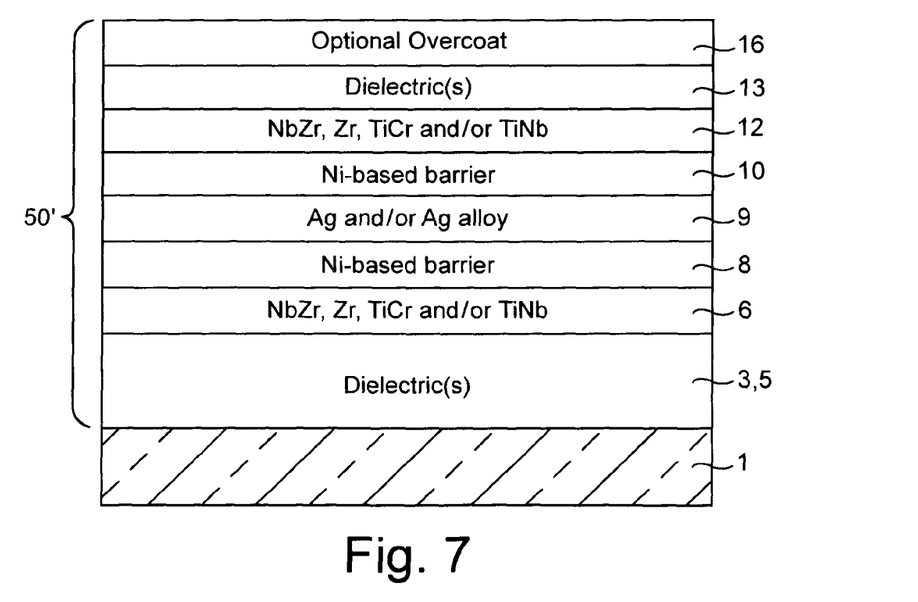
FIG. 7 is a cross-sectional view of a coated article comprising an IR reflecting layer, and first Ni-inclusive barrier layers adjacent the IR reflecting layer, and second metal-based barrier layers adjacent to the first barrier layers, according to still another example embodiment of this invention.

FIG. 7 is based on FIG. 6. In FIG. 7, coating 50' includes layers 6 and/or 12 comprising NbZr, Zr, TiCr and/or TiNb, and layers 8 and/or 10 comprising Ni-inclusive barrier layers.

Figure 8:
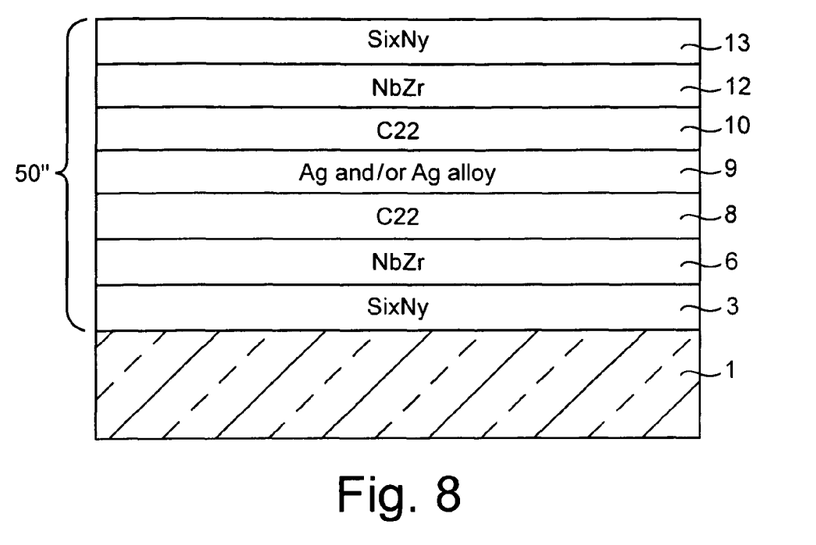
FIG. 8 is a cross-sectional view of a coated article comprising an IR reflecting layer, and first C22-based barrier layers adjacent the IR reflecting layer, and second NbZr-based barrier layers adjacent to the first barrier layers, according to still another example embodiment of this invention.

FIG. 8 is also based on FIG. 6, and illustrates an exemplary example embodiment. In FIG. 8, coating 50" comprises silicon nitride-based dielectric layer 3 (optional dielectric layer 5 is omitted), first "barrier 2" layer 6 comprising NbZr, first "barrier 1" layer 8 comprising C22, silver-based IR reflecting layer 9, second "barrier 1" layer 10 comprising C22, second "barrier 2" layer 12 comprising NbZr, and dielectric layer 13 comprising silicon nitride, which may also serve as a protective overcoat in some instances. However, in other example embodiments, a separate protective overcoat layer 16 may be provided. In certain example embodiments, layer 16 may be zirconium-based, and may be of or include an oxide of zirconium and/or an alloy thereof. It also may further include Al, Ti and/or Mo.

Figure 9:
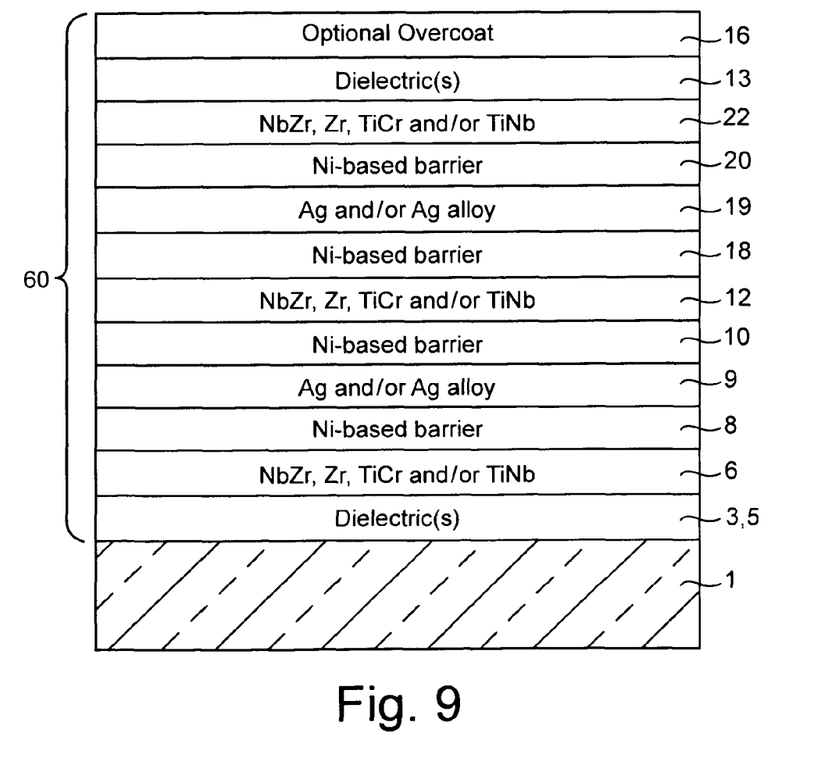
FIG. 9 is a cross-sectional view of a coated article comprising at least two IR reflecting layers, and first Ni-inclusive barrier layers adjacent the IR reflecting layers, and second metal-based barrier layers adjacent to the first barrier layers, according to still another example embodiment of this invention.

FIG. 9 is also similar to the FIG. 6 embodiment, but FIG. 9 is directed to a double-silver coating 60. FIG. 9 includes glass substrate 1, dielectric layer(s) 3 and/or 5, first "barrier 2" layer 6, first "barrier 1" layer 8, first IR reflecting layer 9 comprising Ag, second "barrier 1" layer 10, second "barrier 2" layer 12, third "barrier 1" layer 18, second IR reflecting layer 19 comprising silver, fourth "barrier 1" layer 20, fourth "barrier 2" layer 22, dielectric layer(s) 13, and optional overcoat layer 16. In FIG. 9, "barrier 1" layers 8, 10, 18, and/or 20 may be of or include any of the materials discussed herein with respect to "barrier 1" layers 8 and/or 10. Barrier layer 18 may, however, in certain example instances be of or include a different material as compared to barrier layers 8 and 10. "Barrier 2" layers 6, 12, and 22 may be of or include any of the materials discussed herein with respect to "barrier 2" layers 6 and/or 12. Some, all, or none of dielectric layers 3, 5 and/or 13 may be present according to different example embodiments. Dielectric layers 3, 5, and 13 may be of or include silicon nitride, silicon oxide, silicon oxynitride, tin oxide, titanium oxide, and/or any suitable dielectric material. In other example embodiments, a separate protective overcoat layer 16 may be provided. In certain example embodiments, layer 16 may be zirconium-based, and may be of or include an oxide of zirconium and/or an alloy thereof, optionally further including Al, Ti and/or Mo. Other dielectric layers may be provided in other places in the coating in other examples.

Figure 10:
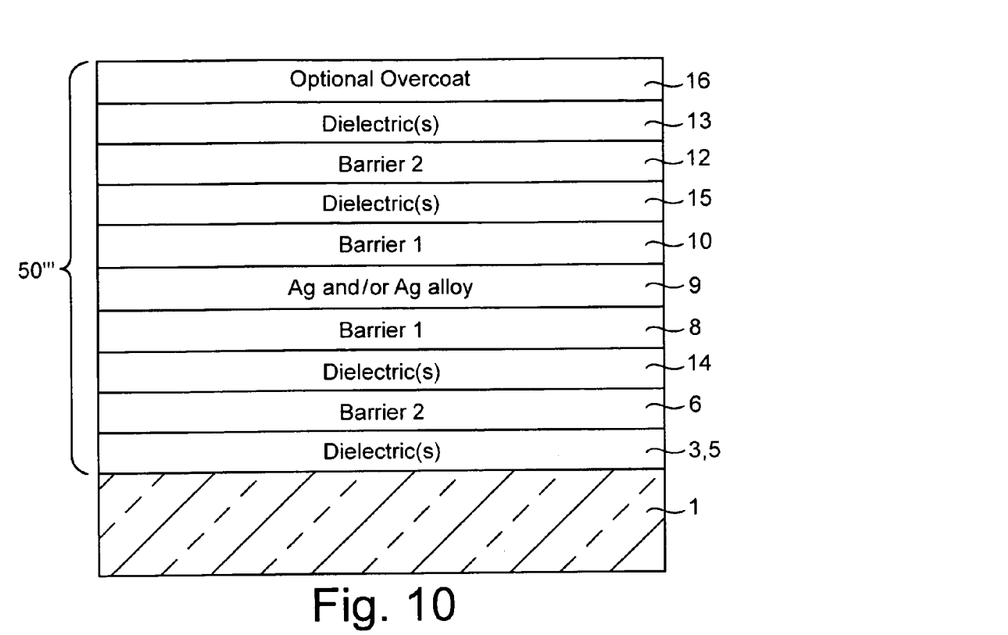
FIG. 10 is a cross-sectional view of a coated article comprising an IR reflecting layer, and first and second barrier layers provided on each side of the IR reflecting layer, wherein the barrier layers closest to and farthest from the glass substrate are sandwiched in between two dielectric layers, according to still another example embodiment of this invention.

FIG. 10 illustrates coating 50''', which is similar to coating 50 shown in FIG. 6. However, coating 50''' further includes dielectric layers 14 and/or 15. In certain example embodiments, these dielectric layers may be provided in between "Barrier 1" and "Barrier 2" under silver-based layer 9, and also may be provided in between "Barrier 2" and "Barrier 1" over silver-based layer 9. In certain example embodiments according to FIG. 10, "Barrier 2" layers 6 and 12 being sandwiched by dielectric layers may further improve the chemical and/or mechanical durability of these layers and/or of the overall coating. Furthermore, the inclusion of dielectric layers 14 and/or 15 in a coating may advantageously further protect the silver-based layer from corrosion and/or scratching. In certain example embodiments, layers 14 and/or 15 may comprise silicon nitride, silicon oxide, silicon oxynitride, titanium oxide, tin oxide, and/or any other appropriate dielectric material. Furthermore, in certain example embodiments, layer 14 and/or 15 may be dense.

Figure 11:
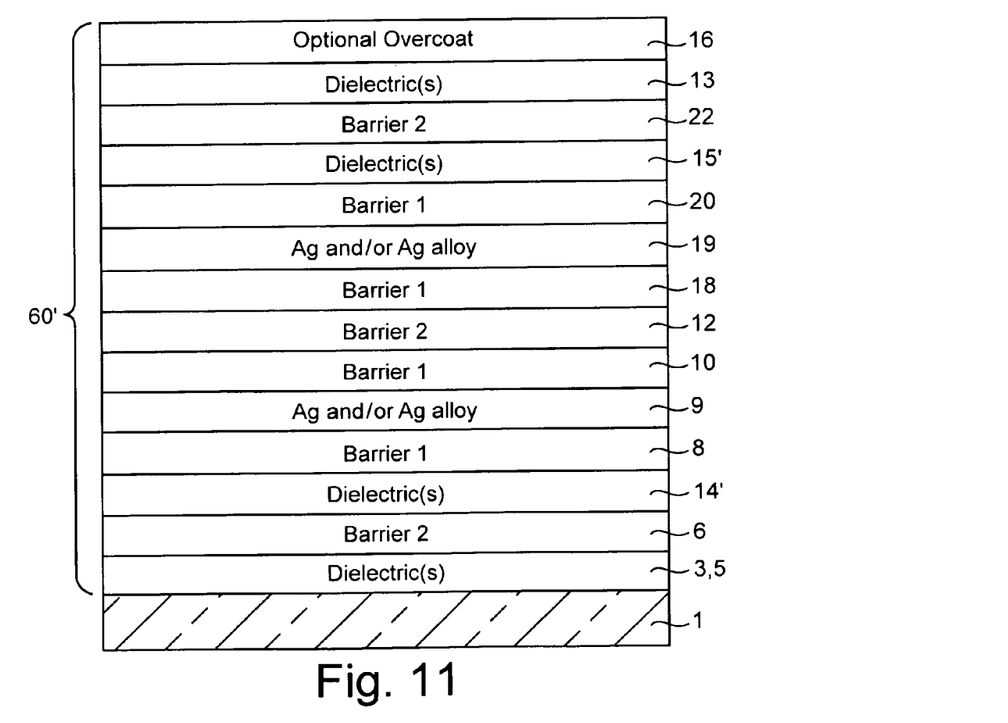
FIG. 11 is a cross-sectional view of a coated article comprising at least two IR reflecting layers, and first and second barrier layers provided on each side of each IR reflecting layer, wherein the barrier layers closest to and farthest from the glass substrate are sandwiched in between two dielectric layers, according to still another example embodiment of this invention.

FIG. 11 illustrates coating 60', which is similar to coating 60 shown in FIG. 9. However, coating 60' also further includes dielectric layers 14' and/or 15'. These layers are similar to layers 14 and 15 discussed above. Layers 14' and 15' also sandwich the "Barrier 2" layers that are closest to the glass substrate and farthest from the glass substrate, respectively. In the FIG. 11 embodiment, layers 6 and 22 are sandwiched by dielectric layers 3 and/or 5 and 14', and 15' and 13, respectively.

Figure 12:
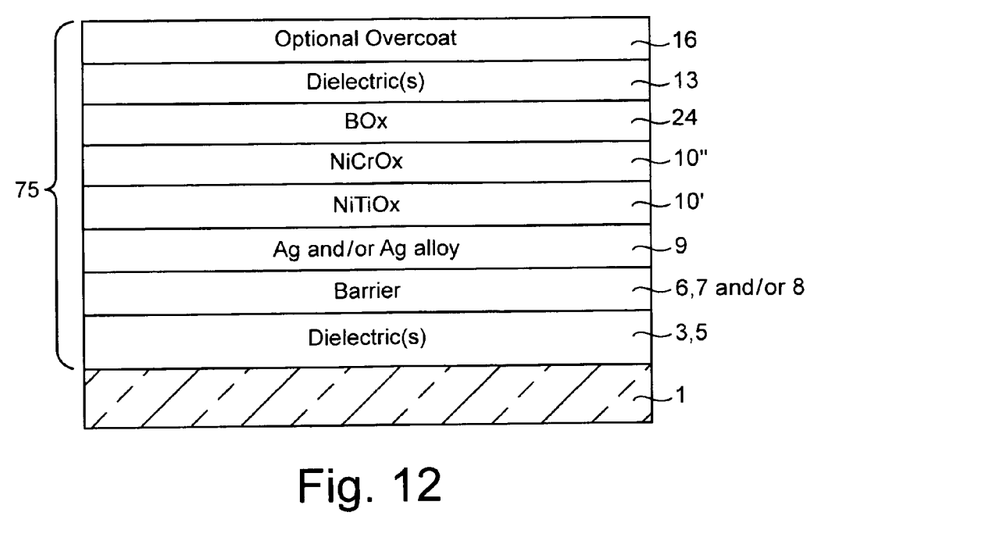
FIG. 12 is a cross-sectional view of a coated article comprising an IR reflecting layer, and a first NiTi-based barrier layer, a second NiCr-based barrier layer, and a third metal oxide-based barrier layer, according to still another example embodiment of this invention.
Figure 13:
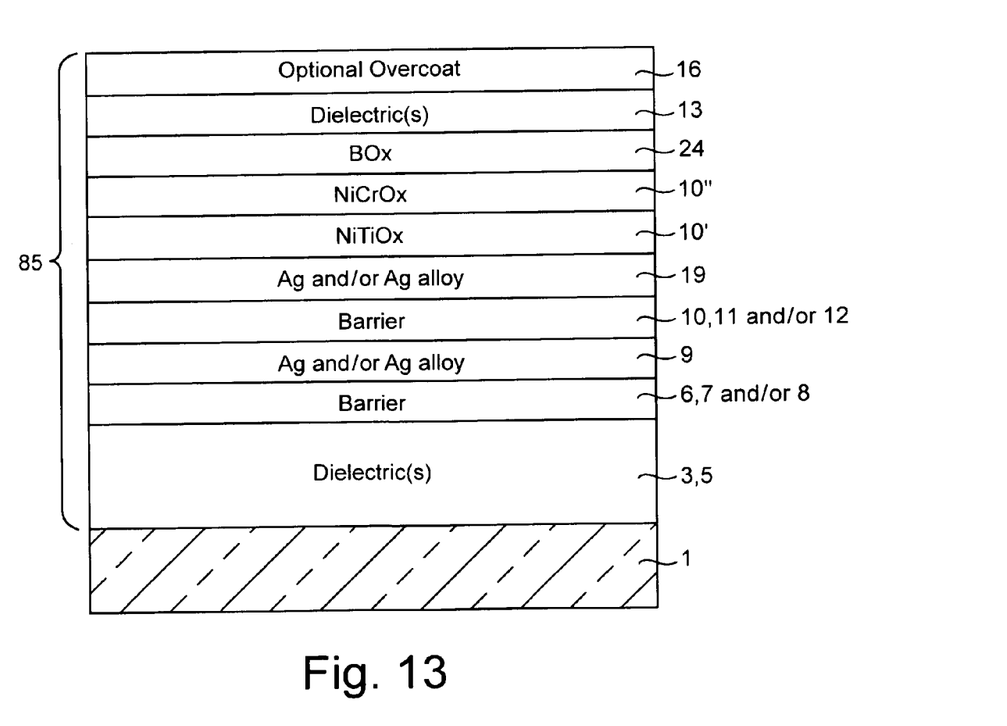
FIG. 13 is a cross-sectional view of a coated article comprising at least two IR reflecting layers, and a first NiTi-based barrier layer, a second NiCr-based barrier layer, and a third metal oxide-based barrier layer, according to still another example embodiment of this invention.

FIGS. 12 and 13 are cross-sectional views of coated articles according to example embodiments of this invention. In FIG. 12, the coated article includes glass substrate 1 (e.g., clear, green, bronze, or blue-green glass substrate from about 1.0 to 10.0 mm thick, more preferably from about 1.0 mm to 6.0 mm thick), and a multi-layer coating 75 (or layer system) provided on the substrate either directly or indirectly. FIG. 12 includes dielectric layer(s) 3 and/or 5, a barrier layer 7 and/or 8, silver-based layer 9, barrier layer 10', barrier layer 10'', and barrier layer 24, as well as dielectric layer(s) 13, which may serve as an overcoat and/or top coat according to different example embodiments. Dielectric layers 3, 5, and 13 may be of or include silicon nitride, silicon oxide, silicon oxynitride, tin oxide, titanium oxide, and/or any suitable dielectric material. Other dielectric layers may be provided in other places in the coating in other examples. In other example embodiments, a separate protective overcoat layer 16 may be provided. In certain example embodiments, layer 16 may be zirconium-based, and may be of or include an oxide of zirconium and/or an alloy thereof, optionally further including Al, Ti and/or Mo.

In FIG. 12, barrier layer 6, 7, and/or 8 may be of or include materials discussed with respect to layer 7 of FIGS. 1-2 comprising a Ni-inclusive ternary alloy, "barrier 1" layer(s) 8 and/or 10, of or including Ni, Cr, Mo, and/or Ti, and/or "barrier 2" layer(s) 6 and/or 12, of or including Nb, Zr, Ti, Cr, and/or Nb. In some examples, only one of layers 6, 7, and 8 will be present in the FIG. 12 embodiment. However, in other embodiments, more of the layers may be present.

FIG. 12 further includes barrier layer 10', barrier layer 10'', and barrier layer 16. In certain example embodiments, barrier layer 10' maybe Ni-inclusive such that it adheres well to the Ag-based layer 9. Particularly, in certain exemplary embodiments, layer 10' may be of or include Ni and/or Ti, and/or an oxide thereof (e.g., $Ni_xTi_yO_z$). Layer 10'' may be of or include Ni and/or Cr, and/or an oxide thereof. Layer 10'' may increase the mechanical durability of the overall coating in certain example embodiments. Finally, layer 24 may be a "Barrier Oxide" (BOx) layer in certain instances. In certain example embodiments, layer 24 may be of or include an oxide of Sn, TiCr, TiNb, NbZr, CrZr, TiMo, ZrMo, NbMo, CrMo, WCr, WMo, WZr, WNb, WTi, CoMo, CoCr, CoZr, CoNb, and/or CoTi. In certain examples, the provision of barrier layer 16 may further improve the durability of the coating.

FIG. 13 is based on FIG. 12, but includes a double IR reflecting layer coating 85. In certain example embodiments, the coated article illustrated in FIG. 13 may be used as a monolithic window with a low-E coating with double IR reflecting layers. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating 85 (or layer system) provided on the substrate either directly or indirectly. FIG. 13 includes dielectric layer(s) 3 and/or 5, a barrier layer 6, 7 and/or 8, silver-based layer 9, barrier layer 10, 11 and/or 12, Ag-based layer 19, barrier layer 10', barrier layer 10'', and barrier layer 24, as well as dielectric layer(s) 13, which may serve as an overcoat and/or top coat according to different example embodiments. In other example embodiments, a separate protective overcoat layer 16 may be provided. In certain example embodiments, layer 16 may be zirconium-based, and may be of or include an oxide of zirconium and/or an alloy thereof, optionally further including Al, Ti and/or Mo. Dielectric layers 3, 5, and 13 may be of or include silicon nitride, silicon oxide, silicon oxynitride, tin oxide, titanium oxide, and/or any suitable dielectric material. Other dielectric layers may be provided in other places in the coating in other examples.

In FIG. 13, barrier layer 6, 7 and/or 8 may be of or include materials discussed with respect to layer 7 of FIGS. 1-2 comprising a Ni-inclusive ternary alloy, "barrier 1" layer(s) 8 and/or 10, of or including Ni, Cr, Mo, and/or Ti, and/or "barrier 2" layer(s) 6 and/or 12, of or including Nb, Zr, Ti, Cr, and/or Nb. In some examples, only one of layers 6, 7, and 8 will be present in the FIG. 13 embodiment. However, in other embodiments, more of the layers may be present.

In FIG. 13, barrier layers 10', 10", and 24 may be of or include the materials discussed herein with respect to layers 10', 10", and 24 in the FIG. 12 embodiment.

In other example embodiments, the barrier layer materials above the silver-based layer may be different from the barrier layer materials provided below the silver-based layer. All possible combinations for the barrier layers mentioned herein may be used for any of the layer stacks shown in the figures and described herein.

In certain example embodiments, all binary, ternary, quaternary etc. alloys described herein may be sputtered from a single metallic and/or ceramic target, or they may be co-sputtered from two or more different targets (metallic and/or ceramic) in different embodiments.

Figure 14:
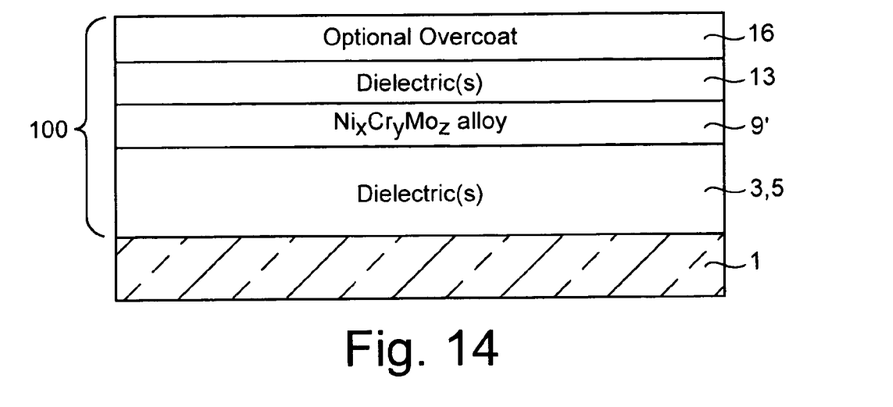
FIG. 14 is a cross-sectional view of a coated article comprising a NiCrMo-based functional layer, according to still further example embodiments of this invention.

FIG. 14 is a cross-sectional view of a coated article according to an example embodiment of this invention. In certain example embodiments, the coated article illustrated in FIG. 14 may be used as a monolithic window with a single functional layer. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating 100 (or layer system) provided on the substrate either directly or indirectly. FIG. 14 includes glass substrate 1, optional dielectric layers 3 and/or 5, functional layer 9' comprising a NiCrMo-based alloy (e.g., C22, BC1, or B3), optional dielectric layer 13, and optional overcoat layer 16. Other layers may be included in this coating. Layer 13 may be of or include silicon oxide, nitride, and/or oxynitride, and/or an oxide of titanium, tin, and/or the like. In certain example embodiments, layer 16 may be zirconium-based, and may be of or include an oxide of zirconium and/or an alloy thereof, optionally further including Al, Ti and/or Mo.

Figure 15:
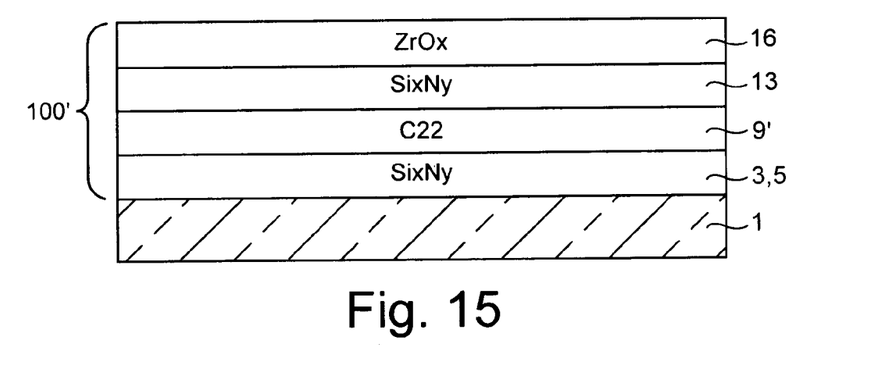
FIG. 15 is a cross-sectional view of a coated article comprising a C22-based functional layer sandwiched between two silicon nitride-based dielectric layers, with a zirconium oxide based overcoat, according to yet another example embodiment of this invention.

FIG. 15 illustrates an exemplary embodiment based on the FIG. 14 embodiment. FIG. 15 includes coating 100'. In FIG. 15, dielectric layer 3 comprises silicon nitride, and dielectric layer 5 is excluded. It is noted that any dielectric layer(s) described herein may be excluded according to different example embodiments. Moreover, these layers may be split, or additional layers may be inserted, according to other example embodiments. Layer 9' is the functional layer of the coating, and layer 9' comprises C22 in the FIG. 15 embodiment. Dielectric layer 13, which as indicated above may comprise more than one discrete layer, comprises silicon nitride, and layer 13' comprises zirconium oxide. ZrOx inclusive layers may be provided as a protective overcoat layer in different embodiments of this invention, including those illustrated and described above. In certain example embodiments, however, a layer comprising SixNy may be provided as an overcoat layer, e.g., as alluded to above.

Figure 16:
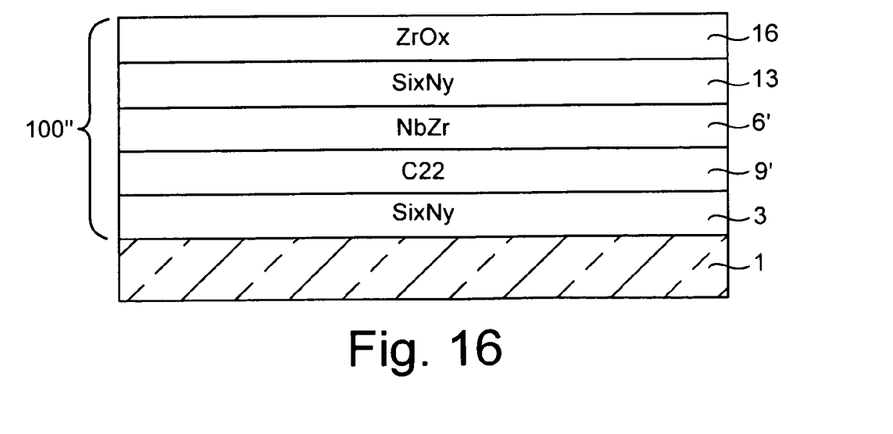
FIG. 16 is a cross-sectional view of a coated article comprising a C22-based functional layer and an NbZr-based barrier layer, sandwiched between dielectric layers with a zirconium oxide-based overcoat, according to still further example embodiments of this invention.

FIG. 16 illustrates a further exemplary embodiment based on the FIG. 14 embodiment. FIG. 16 is similar to FIG. 15, but FIG. 16 further includes barrier layer 6'. Barrier layer 6' may comprise a material discussed in the FIGS. 6-9 embodiments with respect to the "barrier 2" layer. Thus, layer 6' may serve as a barrier layer to functional layer 9', and may be of or include NbZr, as shown in FIG. 16. In other example embodiments, layer 6' may be of or include one or more of Nb, Zr, Ti and/or Cr.

The barrier layers discussed herein may be oxidized and/or nitrided according to different example embodiments. These layers may be deposited in the presence of oxygen and/or nitrogen, and/or may become oxided and/or nitrided during further processing steps such as deposition of subsequent layers and/or heat treatment, according to different example embodiments.

Furthermore, the Ni-based ternary alloys discussed herein may be quaternary alloys or have even more than four materials than four according to different example embodiments. In other words, although certain example embodiments are described as "ternary alloys," it will be appreciated that such alloys may include three or more materials.

In further embodiments, a layer of or including NiCr and/or the target used to sputter said layer may comprise NiCr in a ratio of 20:80, 40:60, 60:40, or 80:20 (by weight). A layer of or including NiMo and/or the target used to sputter said layer may comprise NiMo in a ratio of 20:80, 40:60, 60:40, or 80:20 (by weight). A layer of or including NbCr and/or the target used to sputter said layer may comprise NbCr in a ratio of 20:80, 40:60, 60:40, or 80:20 (by weight). A layer of or including NbZr and/or the target used to sputter said layer may comprise NbZr in a ratio of 20:80, 40:60, 60:40, or 80:20 (by weight). Barrier layers as described herein may further be of or include Haynes 214.

In certain example embodiments, the coated article illustrated in FIGS. 1-16 may be used as a monolithic window with a low-E coating on surface 1 and/or 2, where the low-E coating includes only a single IR reflecting layer. However, in other example embodiments, the coated article in FIG. 1 may comprise further layers. Furthermore, a coated article made according to example embodiments described herein may be used in an insulated glass unit (IGU), with the coating(s) on surface 1, 2, 3, and/or 4; in a laminated monolithic lite with the coating embedded in or disposed on or against the interlayer on surfaces 2 and/or 3, or exposed on surface 4; in a laminated IGU, with a laminate outboard with the coating embedded against the interlayer on surfaces 2 and/or 3, or exposed on surface 4; in a laminated IGU, with a laminated inboard with the coated exposed on surfaces 3 and/or 6, or embedded on surfaces 4 and/or 5, according to different example embodiments and applications. In other words, this coating may be used monolithically, or in IG units comprising two or more substrates, or more than once in a glass unit, and may be provided on any surface of the unit in different example embodiments. However, in other example embodiments, a coated article as described herein may be used with any number of IR reflecting layers and maybe combined with any number of other glass substrates to create a laminated and/or insulated glass unit. The coatings may also be used in connection with IGU, VIG, automotive glass, and any other applications, according to different example embodiments.

Furthermore, the coatings in FIG. 1-16 as described herein may be used on surface 1 for applications in which coatings are directly exposed to the external atmosphere. In certain example embodiments, this may include anti-condensation coatings. In other example embodiments, this may include skylights, vehicle windows and/or windshields, IG units, VIG units, refrigerator and/or freezer doors, and/or the like. The coatings in FIG. 1-16 as described herein may also be applied to surface 4 of double IG units, or surface 6 of triple IG units, to improve a window's U-value. These coatings may also be used monolithically in applications such as storm doors. In certain example embodiments, the coatings as described herein advantageously proved excellent durability and stability, low haze, and smooth, easy to clean properties, in certain example embodiments.

Other example embodiments for coatings described herein, particularly for monolithic coating applications, include anti-condensation coatings. Coatings as described herein may be used for surface 1 anti-condensation applications. This may enable toe coating to be survivable in an outside environment. In certain example embodiments, the coating may have a low hemispherical emissivity such that the glass surface is more likely to retain heat from the interior area. This may advantageously reduce the presence of condensation thereon.

Another example application for the coatings described herein includes the use of an example coating or the materials disclosed herein to surface 4 of an IG unit (e.g., the surface farthest from the sun), exposed to a building's interior. In these cases, the coating would be exposed to the atmosphere. In some cases, this may damage the Ag layer in the stack. However, by using a coating as described herein, the coating including improved barrier materials and/or Ag alloys may have improved corrosion resistance, and better mechanical and/or chemical durability.

Although certain example embodiments have been described as relating to low-E coatings, the various barrier layers described herein may be used in connection with different types of coatings.

A coated article as described herein (e.g., see FIGS. 1-14) may or may not be heat-treated (e.g., tempered) in certain example embodiments. The terms "heat treatment" and "heat treating" as used herein mean heating the article to a temperature sufficient to achieve thermal tempering and/or heat strengthening of the glass inclusive article. This definition includes, for example, heating a coated article in an oven or furnace at a temperature of at least about 550 degrees C., more preferably at least about 580 degrees C., more preferably at least about 600 degrees C., more preferably at least about 620 degrees C., and most preferably at least about 650 degrees C. for a sufficient period to allow tempering and/or heat strengthening. This may be for at least about two minutes, or up to about 10 minutes, in certain example embodiments.

As indicated above, certain example embodiments may include a low-E coating supported by a glass substrate. This coated article may be used monolithically or laminated to another glass or other substrate. The coated article also may be built into an insulated glass (IG) unit. IG units generally comprise first and second substantially parallel spaced apart glass substrates. A seal is provided around the periphery of the substrates, and a gap (which may be at least partially filled with an inert gas such as Ar, Xe, Kr, and/or the like) is maintained between the substrates.

As alluded to above, the example materials disclosed herein may be used in connection with low-E and/or anticondensation applications. Example low-E and/or anticondensation coatings are described in, for example, application Ser. Nos. 12/926,714; 12/923,082; 12/662,894; 12/659,196; 12/385,234; 12/385,802; 12/461,792; 12/591,611; and 12/654,594, the entire contents of which are hereby incorporated herein by reference. Thus, for example, one or more of the barrier layer materials described herein may replace or supplement one of more of the layers comprising Ni and/or Cr in certain example embodiments. In certain example embodiments, one or more of the materials disclosed herein may replace or supplement the functional IR reflecting (typically silver-based) layer or layers.

Some or all of the layers described herein may be disposed via sputter depositing or any other suitable technique such as, for example, CVD, combustion deposition, etc.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A coated article comprising substrate supporting a low-E coating, the coating comprising in order moving away from the substrate:
   a first dielectric layer;
   a first barrier layer;
   a first IR reflecting layer comprising silver, provided over and contacting the first barrier layer;
   a second barrier layer, provided over and contacting the IR reflecting layer; and
   A second dielectric layer provided over the second barrier layer,
   wherein the first and second barrier layers are oxided and by metal weight comprise 54-58 wt. % Ni, 20-22.5 wt. % Cr, and 12.5-14.5 wt. % Mo.

2. The coated article of claim 1, wherein the article comprises only one IR reflecting layer.

3. The coated article of claim 1, further comprising an overcoat layer comprising an oxide of Zr over the second barrier layer.

4. The coated article of claim 3, wherein the layer comprising an oxide of Zr further comprises at least one of Ti, Al and Mo.

5. An insulated glass (IG) unit, comprising:
   the coated article of claim 1; and
   a second substrate substantially parallel and spaced apart from the coated article.

6. A coated article comprising a glass substrate supporting a low-E coating, the low-E coating comprising in order moving away from the glass substrate:
   a dielectric layer;
   a layer comprising metal oxide over the dielectric layer;
   an IR reflecting layer comprising silver over the layer comprising metal oxide; and
   a barrier layer over and contacting the IR reflecting layer, wherein the coating is a low-E coating,
   wherein the barrier layer is oxided and by metal content comprises 54-58 wt. % Ni, 20-22.5 wt. % Cr, and 12.5-14.5 wt. % Mo.

7. The coated article of claim 6, wherein the coating comprises only one IR reflecting layer.

8. The coated article of claim 6, wherein the dielectric layer comprises silicon nitride.

9. The coated article of claim 6, wherein the layer comprising metal oxide by metal content comprises 54-58 wt. % Ni, 20-22.5 wt. % Cr, and 12.5-14.5 wt. % Mo.

10. The coated article of claim 6, wherein the coating further comprises an overcoat layer comprising an oxide of Zr.

11. The coated article of claim 10, wherein the layer comprising an oxide of Zr further comprises at least one of Ti, Al and Mo.

* * * * *